United States Patent [19]

Yoshioka

[11] Patent Number: 4,634,897
[45] Date of Patent: Jan. 6, 1987

[54] COMPARATOR HAVING A HYSTERESIS CHARACTERISTIC

[75] Inventor: Takakazu Yoshioka, Tokyo, Japan
[73] Assignee: NEC Corporation, Tokyo, Japan
[21] Appl. No.: 647,433
[22] Filed: Sep. 5, 1984
[30] Foreign Application Priority Data

Sep. 6, 1983 [JP] Japan .................................. 58-163459

[51] Int. Cl.⁴ .............................................. H03K 5/24
[52] U.S. Cl. ..................................... 307/359; 307/355
[58] Field of Search ............... 307/355, 356, 359, 360, 307/362

[56] References Cited

U.S. PATENT DOCUMENTS

| | | | |
|---|---|---|---|
| 3,988,595 | 10/1976 | Eatock | 307/355 |
| 4,013,898 | 3/1977 | Makino | 307/355 |
| 4,438,349 | 3/1984 | Shoji | 307/359 |

Primary Examiner—John Zazworsky
Attorney, Agent, or Firm—Burns, Doane, Swecker and Mathis

[57] ABSTRACT

The comparator has a differential amplifier receiving first and second inputs and producing an output, a first current source adding a first current to the differential amplifier in response to one potential level of said output, and a second current source adding a second current to the differential amplifier in response to the other potential level of said output. The differential amplifier comprises two input transistors having emitters connected in common and a current mirror as a load having an input section connected to the collector of one of the input transistors and an output section connected to the collector of the other input transistor. The first and second current are fed to the input and output sections of the current mirror, respectively.

7 Claims, 9 Drawing Figures

DIFFERENCE IN VOLTAGE BETWEEN INPUT VOLTAGES

DIFFERENCE IN VOLTAGE BETWEEN INPUT VOLTAGES

COMPARATOR HAVING A HYSTERESIS CHARACTERISTIC

BACKGROUND OF THE INVENTION

1. Field of the Invention

The present invention relates to a comparator and more particularly to a comparator having a hysteresis characteristic.

2. Description of the Prior Art

A comparator having two input terminals has its output determined depending upon a mutual relation between the input voltages applied to the respective input terminals. Such comparator is applied to an input section of a digital circuit, and it operates in such manner that it compares the input signals applied to the respective input terminals and generates an output when predetermined one of the input signals is higher than the other or when the predetermined one is lower than the other. This operation is for the purpose of waveform shaping or noise elimination of the input signals. However, mere comparison of the input signals with each other does not attain a sufficient noise elimination effect. A comparator having a hysteresis characteristic enhances a noise elimination rate by operating in such manner that an output is generated when predetermined one of input signals is higher than the other input signal by a predetermined voltage and the output is inverted when the one input signal becomes lower than the other input signal by another predetermined voltage. The comparator with a hysteresis characteristic still has the following drawbacks. Since a feedback circuit is coupled to one of the input terminals, the hysteresis characteristic is affected by the input signal applied across the input terminals. Moreover, the conventional comparator with a hysteresis characteristic is not suited to a monolithic integrated circuit device, because the feedback circuit sometimes has a resistor of a value which is hard to be realized in a semiconductor chip.

SUMMARY OF THE INVENTION

It is an object of the present invention to provide a comparator circuit adaptable to be formed in a monolithic integrated circuit, which presents any arbitrary hysteresis characteristic for a difference between two input signals.

According to the present invention, there is provided a comparator circuit comprising a differential amplifier including first and second input nodes and first and second output nodes, first and second input terminals coupled to said first and second input nodes, respectively, an output terminal coupled to one of said first and second output nodes, a first constant current source connected to the first output node, a second constant current source connected to the second output node, and means responsive to an output voltage at least one of the first and second output nodes for switching the first and second constant current sources so as to generate an output current from either one of the constant current sources.

In the comparator circuit according to the present invention, by switching the current sources, a current flowing through a transistor connected to either one input node is varied, resulting in a variation in a base-emitter voltage of the transistor. Since the transistors connected to the input nodes form a differential amplifier, the variation in the base-emitter voltage of the transistor causes a change in the threshold voltage at a base of the other transistor. Thus, due to this change in the threshold voltage, a hysteresis characteristic can be obtained. The details of the operation will be explained later with reference to the drawings.

In such a comparator circuit having a hysteresis characteristic, there is no need to connect a feedback circuit to the input terminals, and hence, even if input signals are applied to the respective input terminals, comparison between the input signals can be effected normally. In addition, since the output currents of the first and second constant current sources can be arbitrarily preset, the input voltage differences at which the output is inverted can be arbitrarily set on both the positive and negative sides. Accordingly, any desired hysteresis form can be realized easily. Furthermore, since the hysteresis characteristic is determined by the output current values of the constant current sources, all the constituent elements of the comparator circuit can be easily formed on a semiconductor substrate.

BRIEF DESCRIPTION OF THE DRAWINGS

The above and further objects, features and advantages of the present invention will become more apparent from the following detailed description taken in conjunction with the accompanying drawings, wherein:

Referring to FIG. 1, a comparator having a hysteresis characteristic in the prior art has an output terminal 4 of a conventional differential amplifier 1 connected via a first resistor 5 to a non-inverting input terminal 3 of a differential amplifier 1. A second resistor 6 is connected between this non-inverting input terminal 3 and a reference potential point. An input signal is applied to an inverting input terminal 2 of the differential amplifier 1. In other words, feedback is effected from the output terminal 4 to the non-inverting input terminal 3, and hence positive feedback is applied to the differential amplifier 1.

Figure 1:
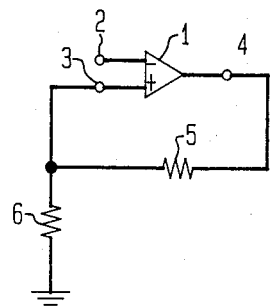
FIG. 1 is a circuit diagram showing a comparator circuit having a hysteresis characteristic in the prior art.

Here, representing the potential at the output terminal 4 by $V_0$, the potential at the non-inverting input terminal 3 by $V_{ref}$, the resistance of the first resistor 5 by $R_1$ and the resistance of the second resistor 6 by $R_2$, then the potential $V_{ref}$ at the non-inverting input terminal 3 is represented by the following equation:

$$V_{ref} = \frac{R_2 \cdot V_O}{R_1 + R_2} \tag{1}$$

If a high level value of the potential at the output terminal 4 is represented by $V_{OH}$ and a low level value thereof by $V_{OL}$, then the potential $V_{refH}$ of the non-inverting input terminal 3 when the potential $V_O$ at the output terminal 4 takes the high level value $V_{OH}$ is represented by the following equation:

$$V_{refH} = \frac{R_2 \cdot V_{OH}}{R_1 + R_2} \tag{2}$$

On the other hand, the potential $V_{refL}$ at the non-inverting terminal 3 when the operating state of the comparator has inverted and the potential $V_O$ at the output terminal 4 has taken the low level value $V_{OL}$ is represented by the following equation:

$$V_{refL} = \frac{R_2 \cdot V_{OL}}{R_1 + R_2} \tag{3}$$

Assuming that the differential amplifier 1 has an ideal operational characteristic, a hysteresis width $V_{TH}$ of the input-output characteristic is represented by the following equation:

$$V_{TH} = \frac{R_2(V_{OH} - V_{OL})}{R_1 + R_2} \tag{4}$$

Figure 2:
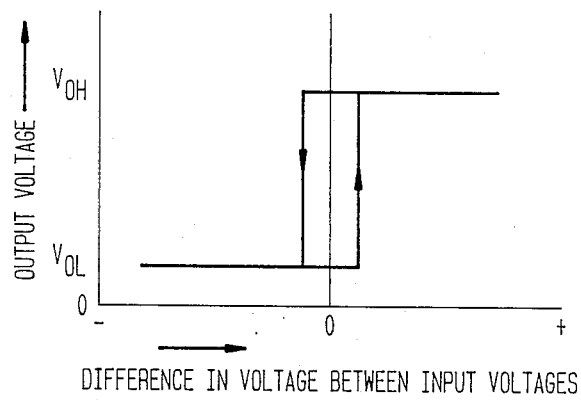
FIG. 2 is an input-output voltage characteristic diagram of a comparator circuit having a hysteresis characteristic in the prior art.

Therefore, by appropriately selecting the resistance ratio between the first resistor 5 and the second resistor 6, it was possible to make an input-output characteristic as shown in FIG. 2 having a hysteresis characteristic of a desired hysteresis width.

However, in the comparator circuit in the prior art shown in FIG. 1, since the first and second resistors 5 and 6 forming a feedback circuit are always connected to the non-inverting input terminal 3, it is impossible to apply another input signal to this non-inverting terminal 3. Even if another input signal were to be applied to the non-inverting input terminal 3, normal comparison between the input signals applied to the input terminals 2 and 3 could not be effected due to influence of the feedback circuit.

Moreover, since feedback by the intermediary of resistors is effected from the output terminal 4 to the non-inverting input terminal 3, the points where an output is inverted are located at symmetric positions on the positive and negative sides of the input voltage with respect to the position where the inverting input terminal 2 and the non-inverting input terminal 3 are held at the same potential. The input voltage differences at which the output is inverted could not be preset arbitrarily.

Furthermore, since the hysteresis width was determined by resistance values in the feedback circuit, depending upon the resistance values the feedback circuit of the comparator circuit could not be formed in a semiconductor integrated circuit. Especially, in the case where the hysteresis width is small, a resistor having an extremely high resistance is necessitated as the resistor 6 or a resistor having an extremely low resistance is necessitated as the resistor 5. In such cases, these resistors cannot be realized in a semiconductor chip, and are compelled to be externally attached to a semiconductor integrated circuit device.

DESCRIPTION OF THE PREFERRED EMBODIMENTS

Figure 3:
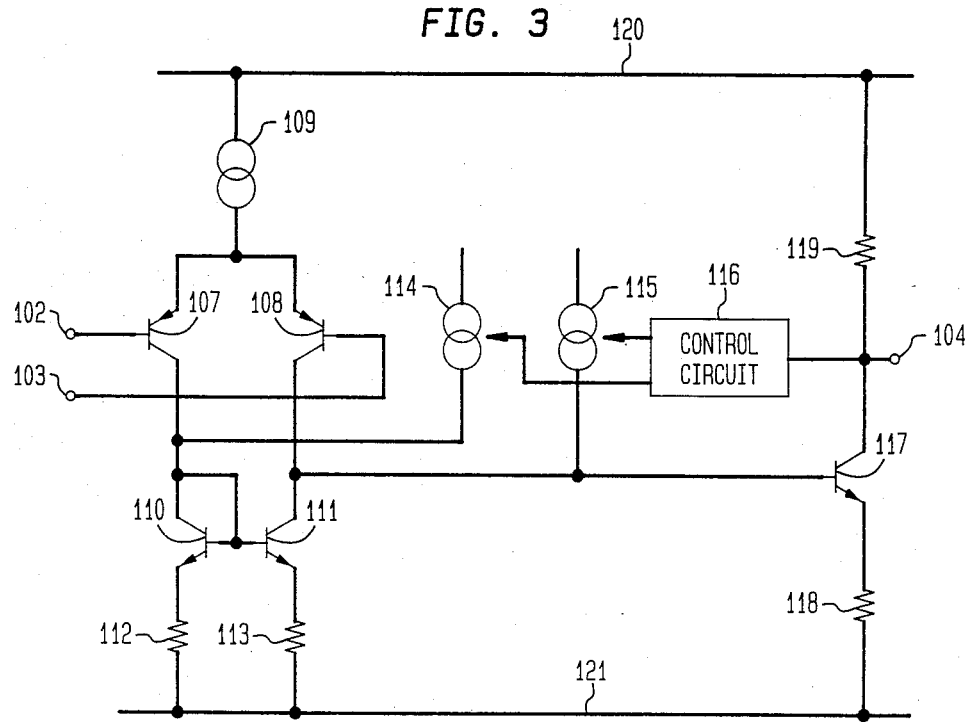
FIG. 3 is a circuit diagram showing a principle of the present invention.

Referring to FIG. 3, a comparator of the present invention comprises a differential amplifier including first and second input transistors 107 and 108 having their bases connected to an inverting input terminal 102 and a non-inverting input terminal 103, respectively, a constant current source 109 connected to common emitters of these input transistors 107 and 108, and a current mirror consisting of transistors 110 and 111 and resistors 112 and 113 which serve as loads connected to the respective collectors of these input transistors 107 and 108. The comparator further comprises an output transistor 117 having its base connected to the differential amplifier, a bias resistor 118 and a load resistor 119 of the output transistor 117, an output terminal 104, a positive power supply line 120, a negative power supply line 121, a first constant current source 114 connected to a junction point between the collector of the first input transistor 107 and the load transistor 110 of the differential amplifier, a second constant current source 115 connected to a junction point between the collector of the second input transistor 108 and the load transistor 111, and a control circuit 116 which controls the first and second constant current sources 114 and 115 depending upon the electrical state at the output terminal 104.

Assuming now that the potential at the non-inverting input terminal 103 is sufficiently lower than that at the inverting input terminal 102, the first input transistor 107 is turned OFF, while the second input transistor 108 and the output transistor 117 are turned ON. Thus, the potential at the output terminal 104 takes a low level. At this moment, the control circuit 116 operates so as to switch OFF the first constant current source 114 to generate no constant current and switch ON the second constant current source 115 to generate a constant current. In other words, the constant current of the second constant current source 115 is added to the collector of the transistor 111 together with the collector current of the second input transistor 108.

Subsequently, as the potential at the non-inverting input terminal 103 rises and becomes higher than the potential at the inverting input terminal 102, the operation of the comparator inverts to a condition where a collector current $I_{C1}$ of the first input transistor 107 becomes equal to the sum of a collector current $I_{C2}$ of the second input transistor 108 plus a constant current $I_{S2}$ of the second constant current source 115. In other words, the following equation is fulfilled:

$$I_{C1} = I_{C2} + I_{S2} \tag{5}$$

Under this condition, voltage difference $V_1$ between input voltages is represented by the following equation:

$$V_1 = V_{BE1} - V_{BE2} \tag{6}$$

where $V_{BE1}$ and $V_{BE2}$ represent the base-emitter voltages of the first and second input transistors 107 and 108, respectively. Now, substituting the relation between a base-emitter voltage and an emitter current of a transistor in Equation (6) above, the following relation can be obtained:

$$V_I = V_T \ln \frac{I_{C1}}{I_{C2}} \quad (7)$$

where $V_T$ represents a thermal voltage which is nearly equal to 26 mV. Then, substituting Equation (5) into Equation (7), the following relation is derived:

$$V_I = V_T \ln \left(1 + \frac{I_{S2}}{I_{C2}}\right) \quad (8)$$

In other words, in order to invert the potential at the output terminal 104 of the comparator shown in FIG. 3 from a low level to a high level, it is necessary to raise the potential at the non-inverting input terminal 103 higher than the potential at the inverting input terminal 102 by an amount equal to or larger than the above-described voltage difference $V_I$.

On the other hand, in the case where the potential at the non-inverting input terminal 103 is sufficiently higher than that at the inverting input terminal 102, the potential at the output terminal 104 takes a high level, and in response to this potential at the output terminal 104 the control circuit 116 operates so as to switch ON the first constant current source 114 and switch OFF the second constant current source 115. Now, as the potential at the non-inverting input terminal 103 falls and becomes lower than the potential at the inverting input terminal 102, the operation of the comparator inverts. The boundary condition for the inversion of the comparator is that the potential at the non-inverting input terminal 103 falls lower than that at the inverting input terminal 102 by an amount equal to or larger than the following voltage $V_I'$:

$$V_I' = V_T \ln \left(1 - \frac{I_{S1}}{I_{C2}}\right) \quad (9)$$

where $V_I'$ represents a voltage difference of the input voltages under such boundary condition, and $I_{S1}$ represents a constant current value of the first constant current source 114.

In such comparator circuit, a feedback circuit is not connected either to the inverting input terminal 102 nor to the non-inverting input terminal 103. Consequently, it is possible to apply two input signals to be compared directly to these input terminals 102 and 103 and exactly carry out comparison between these two input signals.

In addition, the constant current value $I_{S1}$ of the first constant current source 114 and the constant current value $I_{S2}$ of the second constant current source 115 can be preset independently, and so, if these constant current values are differently set, it is possible to set a hysteresis characteristic which has independent inversion input voltage differences with respect to the inversions of the comparator on the positive and negative sides, according to Equation (8) and Equation (9) above.

Figure 4:
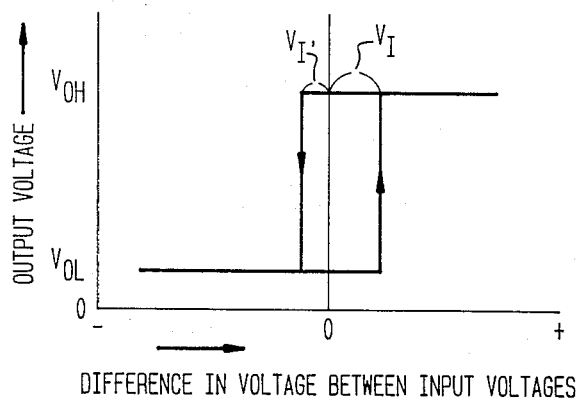
FIG. 4 is a diagram showing one example of an input-output voltage characteristic of a comparator circuit provided according to the present invention.

FIG. 4 is a diagram showing an input-output characteristic of the above-described comparator according to the present invention. As indicated in FIG. 4, the shape of the hysteresis characteristic is determined by the magnitudes of the differential input voltages $V_I$ and $V_I'$ which are determined by the constant current values $I_{S2}$ and $I_{S1}$ of the second and first constant current sources 115 and 114 in accordance with the Equation (8) and Equation (9), respectively.

Furthermore, this comparator circuit is formed of transistors and resistors, and a hysteresis characteristics having a narrow hysteresis width can be realized by merely selecting the output current values $I_{S1}$ and $I_{S2}$ of the constant current sources 114 and 115 to be small, without making use of resistors having an extremely high resistance or an extremely low resistance. Accordingly, the entire comparator circuit can be easily formed in a monolithic semiconductor integrated circuit.

Figure 5:
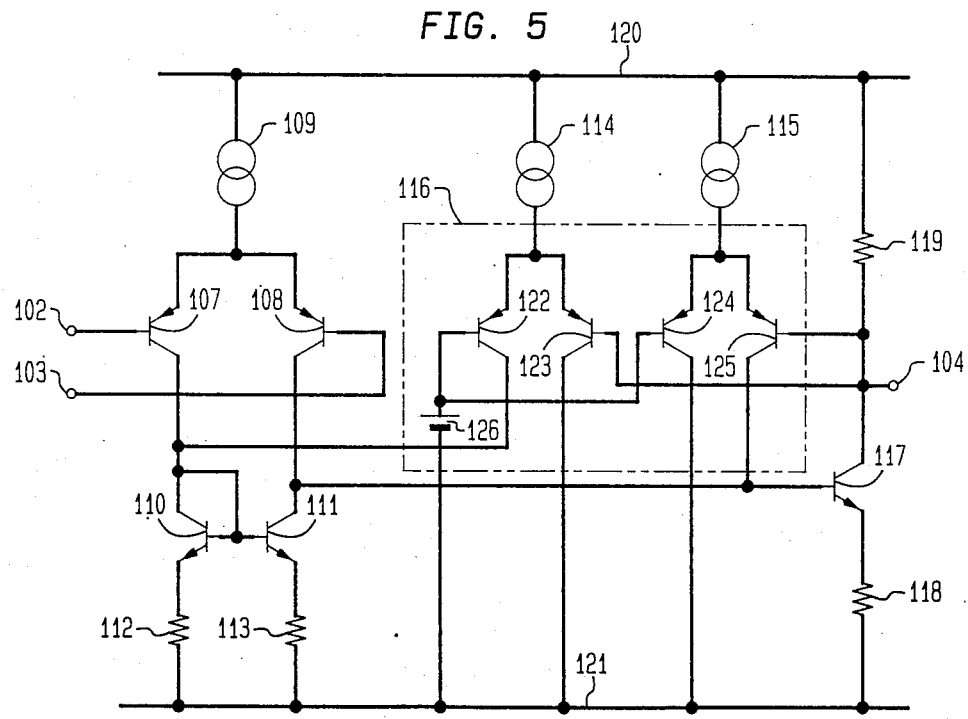
FIG. 5 is a circuit diagram showing one preferred embodiment of the present invention.

FIG. 5 shows one preferred embodiment of the present invention, in which especially the control circuit 16 in FIG. 3 is practically embodied. In this figure, the constant current sources 109, 114 and 115 are represented by symbol marks of a constant current source, because they can be easily realized by any known techniques. Also, with regard to the basic operation of the differential input stage and the operation of the output transistor 117, since they have been already described previously, further description thereof will be omitted. As an example, power voltage between the power supply lines 120 and 121 is 12 volts, and the constant current values of the constant current sources 109, 114 and 115 are 200 μA, 20 μA and 40 μA, respectively.

The embodied control circuit 116 is composed of a first differential type comparator consisting of transistors 122 and 123, a second differential type comparator consisting of transistors 124 and 125, and a bias source 126. Common emitters of the transistors 122 and 123 in the first differential type comparator is connected to a first constant current source 114, and common emitters of the transistors 124 and 125 in the second differential type comparator is connected to a second constant current source 115. Bases of the transistors 123 and 125 are connected to the output terminal 104, and bases of the transistors 122 and 124 are connected to the bias source 126. Collectors of the transistors 122 and 125 are respectively connected to a junction point between the collector of the first input transistor 107 and the load transistor 110 and a junction point between the collector of the second input transistor 108 and the load transistor 111. Collectors of the transistors 123 and 124 are connected to a negative power supply line 121. The potential of the bias source 126 is preset at a potential between a high level value $V_{OH}$ and a low level value $V_{OL}$ of the potential at the output terminal 104, and practically the bias source 126 can be realized by means of a diode chain or the like. As an example, the high and low level values $V_{OH}$ and $V_{OL}$ are 12 and 0.5 volts, respectively.

Owing to the above-described circuit construction and the circuit parameter example, when the potential at the non-inverting input terminal 103 becomes lower than the potential at the inverting input terminal 102 by at least 5.2 mV and hence the output terminal 104 takes a low level $V_{OL}$, the transistors 123 and 125 are turned ON, the transistors 122 and 124 are turned OFF, and so, the constant current of 40 μA fed from the second constant current source 115 is added to the collector current of the second input transistor 108 through the transistor 125, while the constant current fed from the first constant current source 114 is wastefully passed to the negative power supply line 121 through the transistor 123.

On the other hand, when the potential at the non-inversion input terminal 103 becomes higher than the potential at the inverting input terminal 102 by 10.5 mV and hence the output terminal 104 takes a high level $V_{OH}$, the transistors 122 and 124 are turned ON, the transistors 123 and 125 are turned OFF, and so, the constant current of 20 μA fed from the first constant current source 114 is added to the collector current of the first input transistor 107 through the transistor 122, while the constant current fed from the second constant current source 115 is wastefully passed to the negative power supply line 121 through the transistor 124.

As described above, the embodiment shown in FIG. 5 fulfils all the essential conditions for the construction and operation of the comparator circuit according to the present invention, which have been previously explained with reference to FIG. 3.

Figure 6A:
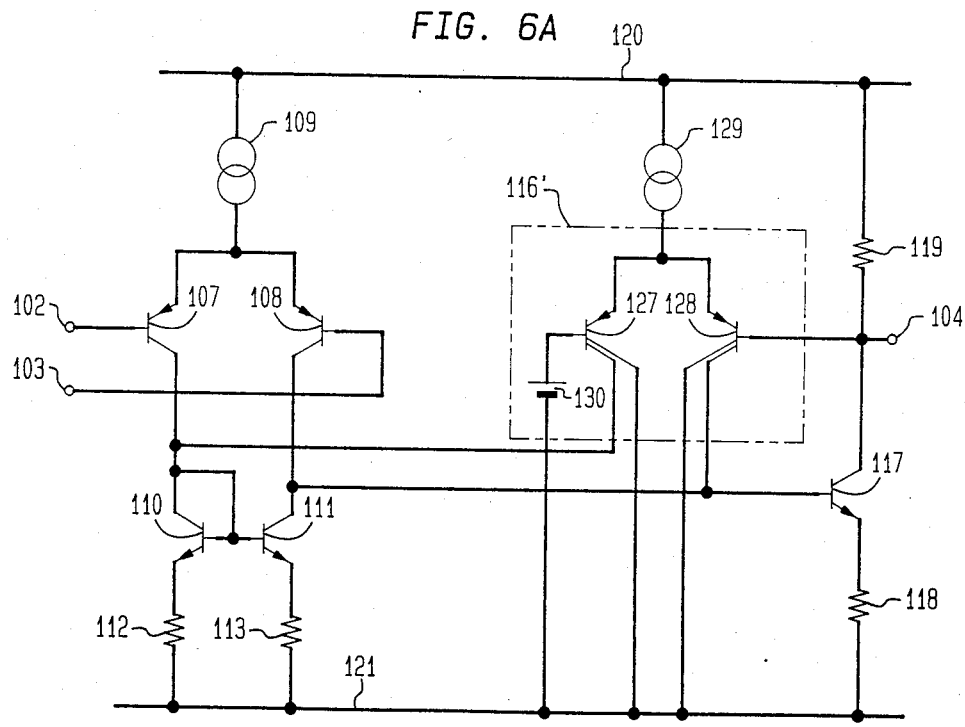
FIG. 6(A) is a circuit diagram showing another preferred embodiment of the present invention.

FIG. 6(A) shows another preferred embodiment of the present invention which is especially suitable for forming a comparator circuit in a semiconductor integrated circuit. In this circuit, only a control circuit 116' is different from the first embodiment shown in FIG. 5. The differential type comparator in the control circuit 116' is composed of lateral PNP transistors 127 and 128 having a multi-collector structure with their emitters connected in common. The bases of the first and second transistors 127 and 128 are respectively connected to a bias source 130 and the output terminal 104. A first collector of the first transistor 127 is connected to a junction point between the collector of the first input transistor 107 and the load transistor 110, while a second collector of the first transistor 127 is connected to the negative power supply line 121. A first collector of the second transistor 128 is connected to the negative power supply line 121, while a second collector of the second transistor 128 is connected to a junction point between the collector of the second input transistor 108 and the load transistor 111.

In the illustrated circuit, when the potential at the output terminal 104 is at a low level, the transistor 128 is turned ON, and hence among the constant current fed from the constant current source 129, one part is wastefully passed to the negative power supply line 121 through the first collector of the transistor 128, and the remaining part is added to the collector current of the second input transistor 108 through the second collector of the transistor 128. The ratio of currents flowing through the first and second collectors of the transistor 128 depends on the ratio of the collector areas. On the other hand, when the potential at the output terminal 104 is at a high level, the transistor 127 is turned ON, and hence among the constant current fed from the constant current source 129, one part is added to the collector current of the first input transistor 107 through the first collector of the transistor 127, and the remaining part is wastefully passed to the negative power supply line 121 through the second collector of the transistor 127. The ratio of currents flowing through the first and second collectors of the transistor 127 is also depends on the ratio of the collector areas.

Figure 6B:
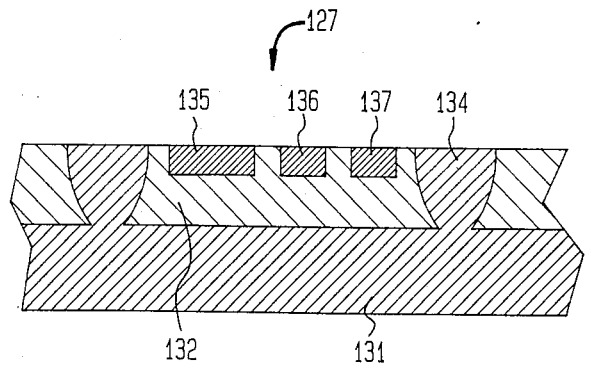
FIG. 6(B) is a cross-section view of a multi-collector transistor employed in the embodiment shown in FIG. 6(A)

In more detail, as shown in FIG. 6(B), the lateral PNP transistor 127 (or 128) having a multi-collector structure has a structure having one P-type emitter region 136 and two P-type collector regions 135 and 137 in one of island regions 132 which is formed by dividing an N-type epitaxial layer on a P-type silicon substrate 131 with P-type isolation regions 134. The area ratio of the collector region 135 to the collector region 137 is designed in accordance with the ratio of the current flowing from the emitter region 136 to the collector region 135 to the current flowing from the emitter region 136 to the collector region 137. Accordingly, in the modified embodiment shown in FIG. 6(A), the currents flowing from the control circuit 116' to the load transistors 110 and 111 can be easily preset by varying the area ratio between two collector regions 135 and 137 in each of the lateral PNP transistors 127 and 128. Since this can be easily achieved by appropriately designing a diffusion mask to be used upon forming the collector regions 135 and 137 and the emitter region 136 the comparator circuit according to the above-described modified embodiment can be said to be a circuit especially suitable for a semiconductor integrated circuit.

Figure 6C:
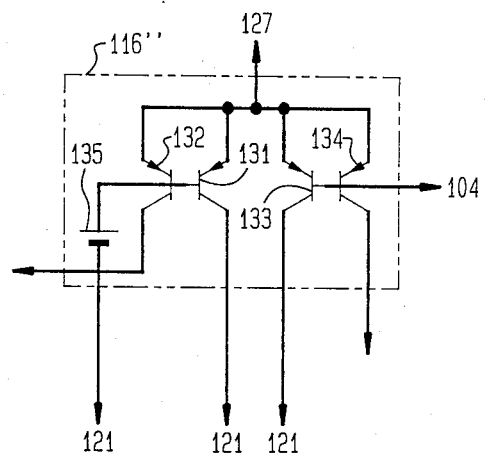
FIG. 6(C) is a circuit diagram showing a modification of a control circuit included in the embodiment shown in FIG. 6(A)

FIG. 6(C) shows a modification of the control circuit 116' in the embodiment shown in FIG. 6(A). In this further modification, in place of the multi-collector PNP transistors 127 and 128, PNP transistors 131 and 132 having their bases and emitters respectively connected in common and PNP transistors 133 and 134 also having their based and emitters respectively connected in common, are employed. All the emitters of the respective PNP transistors 131~134 are connected to the constant current source 129. The bases of the PNP transistors 131 and 132 are connected to a bias source 135, and the bases of the PNP transistors 133 and 134 are connected to the output terminal 104. The collectors of the PNP transistors 131 and 133 are both connected to the negative power supply line 121, while the collector of the PNP transistor 132 is connected to the collector of the first input transistor 107, and the collector of the PNP transistor 134 is connected to the collector of the second input transistor 108. In the respective paired-transistor circuits, the ratio between the collector currents flowing through the PNP transistors 131 and 132, respectively, is equal to the emitter area ratio between the PNP transistors 131 and 132, and likewise, the ratio between the collector currents flowing through the PNP transistors 133 and 134, respectively, is equal to the emitter area ratio between the PNP transistors 133 and 134. Accordingly, by varying the emitter area ratios between the respective paired-transistors, the currents flowing into the differential amplifier formed of the first and second input transistors 107 and 108 can be varied, and thereby a hysteresis width of the hysteresis characteristic of the comparator circuit can be adjusted.

Figure 7:
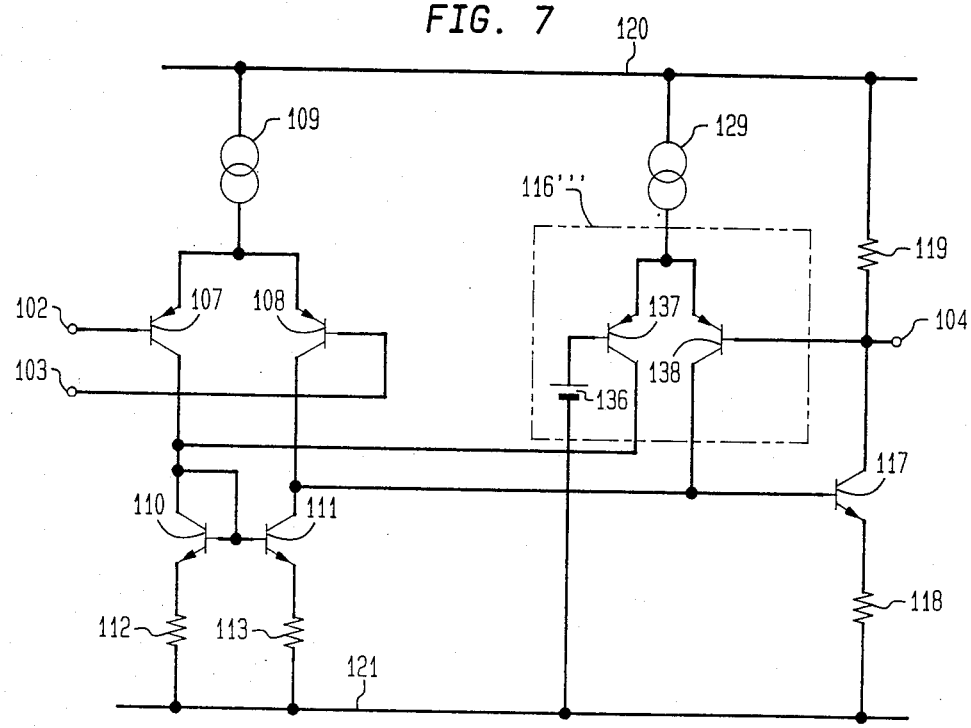
FIG. 7 is a circuit diagram showing still another preferred embodiment of the present invention.

Still another embodiment of the present invention illustrated in FIG. 7, is a comparator circuit in the case where the absolute values of the differences between the voltages at the first and second input terminals 102 and 103 when the output is switched from a high level to a low level and when the output is switched from a low level to a high level, are equal to each other. In such cases, the construction of a control circuit 116''' can be simplified. More particularly, the control circuit 116''' can be formed of PNP transistors 137 and 138 connected in a differential form and a bias source 136. The base of the PNP transistor 137 is connected to the bias source 136, while the base of the PNP transistor 138 is connected to an output terminal 104. The constant current fed from the constant current source 129 flows selectively to the collector of the load transistor 110 through the transistor 137 or to the collector of the load transistor 111 through the transistor 138. Although the current flowing into the collector of the load transistor 110 and the current flowing into the load transistor 111 cannot be made different, a hysteresis characteristic can be obtained.

In this embodiment, it is also the same as the other embodiments that a feedback circuit is not connected to the base of either the first input transistor 107 nor the second input transistor 108, and so, two input signals applied respectively to these bases can be exactly compared. It is also the same as the other embodiments that a comparator whose circuit construction is simple and suitable for a semiconductor integrated circuit, can be provided.

As described in detail above, according to the present invention there is provided a comparator having a hysteresis characteristic in which two inputs can be exactly compared with each other. The conductivity type of all the transistors in the respective embodiments may be changed with the change of polarity of the power supply voltage.

What is claimed is:

1. A comparator circuit comprising first and second input terminals, first and second input transistors having their bases respectively connected to said first and second input terminals, first means for connecting said first and second transistors as a differential amplifier having first and second output nodes, an output terminal coupled to one of said first and second output nodes, second means for feeding a first constant current to said first output node, third means for feeding a second constant current to said second output node, and fourth means responsive to a voltage potential at said output terminal for selectively actuating said second means or said third means.

2. A comparator circuit as claimed in claim 1, in which said differential amplifier includes, as a load, a current mirror circuit having an input section connected to a collector of one of said first and second input transistors and having an output section connected to a collector of the other of said first and second input transistors.

3. A comparator circuit as claimed in claim 2, in which said second means includes a first constant current source for generating said first constant current, first and second control transistors having their emitters connected in common to said first constant current source, a bias source connected to the base of said first control transistor, means for connecting the base of said second control transistor to said output terminal, and means for connecting the collector of said first control transistor to said first output node, and said third means includes a second constant current source for generating said second constant current, third and fourth control transistors having their emitters connected in common to said second constant current source, means for connecting the base of said third control transistor to said bias source, means for connecting the base of said fourth control transistor to said output terminal, and means for connecting the collector of said fourth control transistor to said second output node.

4. A comparator circuit comprising first and second input terminals, a differential amplifier circuit having first and second input sections connected to said first and second input terminals, respectively, and first and second output sections, an output terminal coupled to one of said first and second output sections, a constant current source, first means responsive to a predetermined potential level at said output terminal for feeding a current from said constant current source to said first output section, and second means responsive to another predetermined potential level at said output terminal for feeding the current from said constant current source to said second output section.

5. A comparator circuit as claimed in claim 4, in which said differential amplifier circuit includes, as a load, a current mirror circuit having an input end connected to said first output section and having an output end connected to said second output section.

6. A comparator circuit as claimed in claim 5, in which said first means is a first transistor, said second means is a second transistor, the emitters of said first and second transistors are connected in common to said constant current source, the collector of said first transistor is connected to said first output section, and the collector of said second transistor is connected to said second output section.

7. A comparator circuit as claimed in claim 5, in which said first means and said second means are respectively multi-collector transistors having an emitter, a first collector and a second collector, the emitters being connected in common to said constant current source, the first collectors of said multi-collector transistors being respectively connected to said first output section and said second output section, and the second collectors of said multi-collector transistors being connected to drain current from said constant current source.

* * * * *